(12) United States Patent
Taniguchi et al.

(10) Patent No.: US 7,572,335 B2
(45) Date of Patent: Aug. 11, 2009

(54) CRYSTALLIZATION APPARATUS AND CRYSTALLIZATION METHOD

(75) Inventors: Yukio Taniguchi, Yokohama (JP);
Masakiyo Matsumura, Yokohama (JP);
Hirotaka Yamaguchi, Yokohama (JP);
Mikihiko Nishitani, Yokohama (JP);
Susumu Tsujikawa, Yokohama (JP);
Yoshinobu Kimura, Yokohama (JP);
Masayuki Jyumonji, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 647 days.

(21) Appl. No.: 10/958,396

(22) Filed: Oct. 6, 2004

(65) Prior Publication Data

US 2005/0048383 A1    Mar. 3, 2005

Related U.S. Application Data

(63) Continuation of application No. PCT/JP03/03367, filed on Mar. 19, 2003.

(30) Foreign Application Priority Data

Jul. 11, 2002    (JP)    ............................. 2002-202009

(51) Int. Cl.
  *C30B 35/00*    (2006.01)
(52) U.S. Cl. ...................... 117/201; 117/200; 117/202; 117/900; 117/904; 117/905; 250/206.1; 430/5
(58) Field of Classification Search ............... 117/200, 117/201, 202, 203; 373/22; 430/5, 1; 250/1
See application file for complete search history.

(56) References Cited

U.S. PATENT DOCUMENTS 6,377,336 B1 *    4/2002    Shiraishi et al. ............... 355/67

(Continued)

FOREIGN PATENT DOCUMENTS

EP    1 047 119    10/2000

(Continued)

OTHER PUBLICATIONS

Chang-Ho OH, Motohiro Ozawa and Masakiyo Matsumura, A Novel Phase-Modulated Excimer-Laser Crystallization Method of Silicon Thin Films, Jpn. J. Appl. Phys. vol. 37 (1998), Part 2, No. 5A, May 1, 1998 @ 1998 Publication Board, Japanese Journal of Applied Physics, pp. L492-L495.

(Continued)

*Primary Examiner*—Felisa C Hiteshew
(74) *Attorney, Agent, or Firm*—Oblon, Spivak, McClelland, Maier & Neustadt, P.C.

(57) ABSTRACT

A crystallization apparatus includes an illumination system which illuminates a phase-shift mask and an image-forming optical system arranged in an optical path between the phase-shift mask and a semiconductor film. The semiconductor film is irradiated with a light beam having a light intensity distribution of inverted peak patterns whose light intensity is the lowest in portions corresponding to phase shift sections to form a crystallized semiconductor film. The image-forming optical system is located to optically conjugate the phase-shift mask and the semiconductor film and has an aberration corresponding to the given wavelength range to form a light intensity distribution of inverted peak patterns with no swell of intensity in the middle portion.

12 Claims, 8 Drawing Sheets

U.S. PATENT DOCUMENTS 6,734,635 B2 * 5/2004 Kunii et al. ............... 315/169.3
6,746,942 B2 * 6/2004 Sato et al. .................. 438/586
7,345,746 B2 * 3/2008 Takami ........................ 356/30

FOREIGN PATENT DOCUMENTS

JP      2000-306859 A   11/2000

OTHER PUBLICATIONS

Masakiyo Matsumura, Preparation of Ultra-Large Grain Silicon Thin-Films by Excimer-Laser, vol. 21, No. 5, pp. 278-287, 2000, Mar. 28, 2000, pp. 34-43.

* cited by examiner

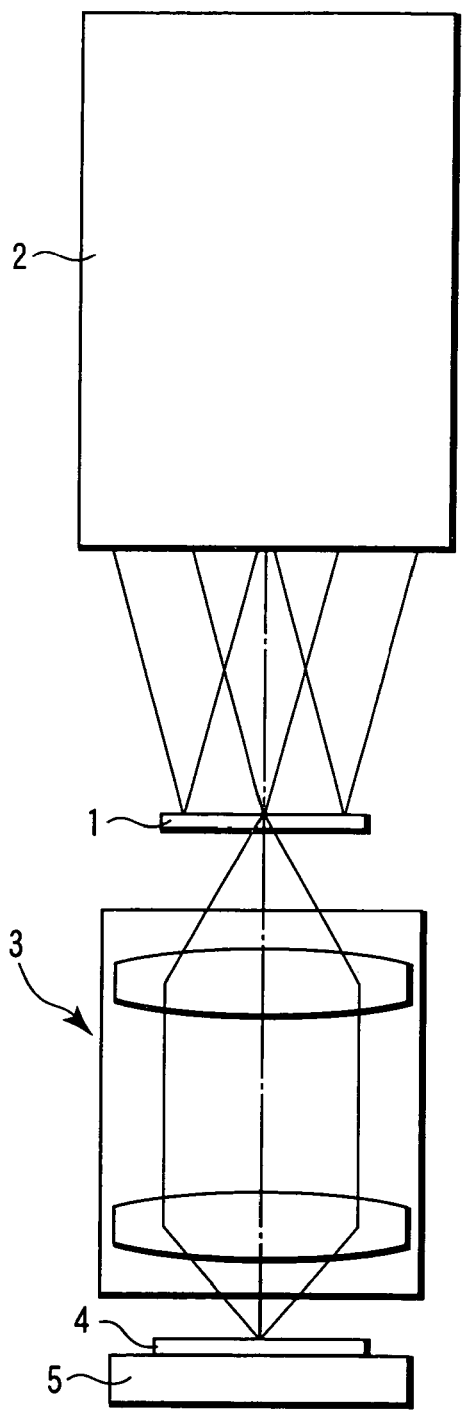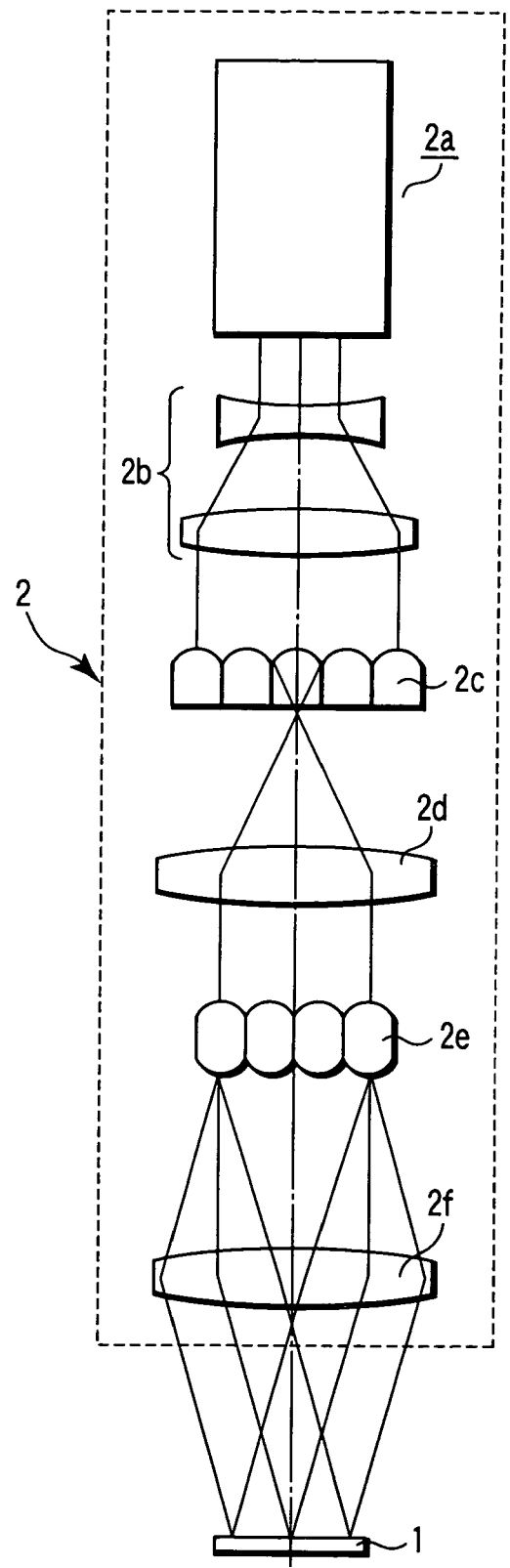
FIG. 1
FIG. 2

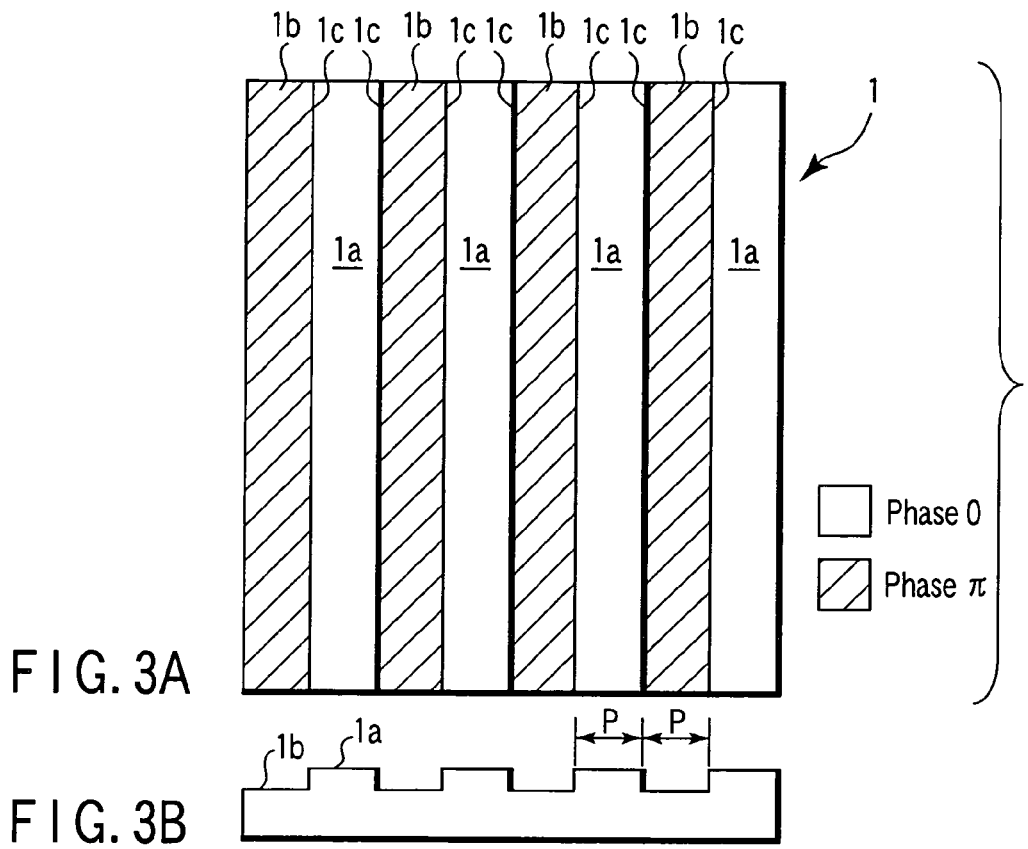
FIG. 3A
FIG. 3B
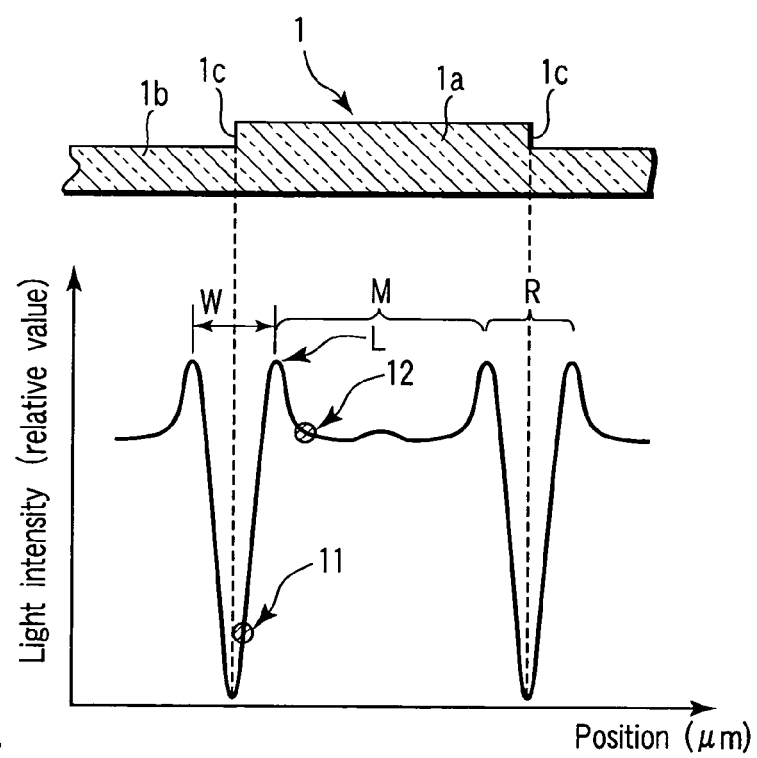
FIG. 4

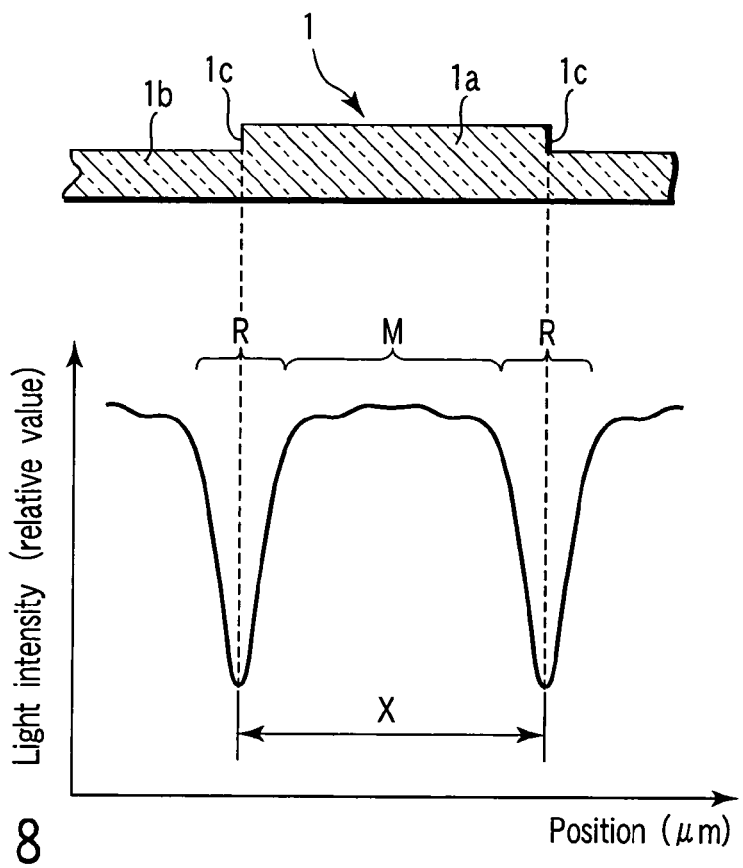
FIG. 8
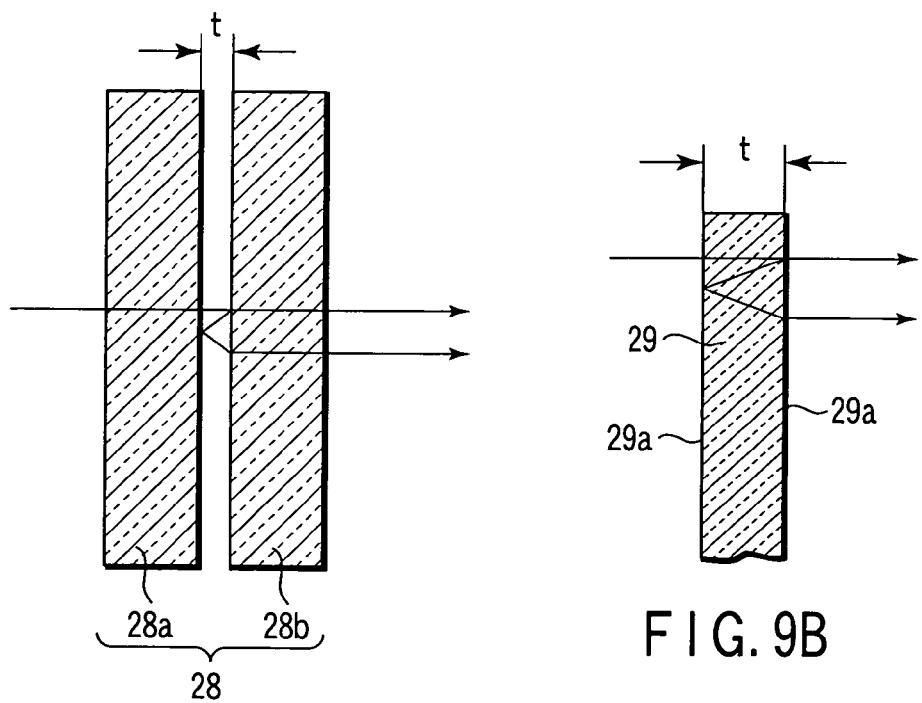
FIG. 9A
FIG. 9B

US 7,572,335 B2

CRYSTALLIZATION APPARATUS AND CRYSTALLIZATION METHOD

CROSS-REFERENCE TO RELATED APPLICATIONS

This is a Continuation Application of PCT Application No. PCT/JP03/03367, filed Mar. 19, 2003, which was published in Japanese.

This application is based upon and claims the benefit of priority from prior Japanese Patent Application No. 2002-202009, filed Jul. 11, 2002, the entire contents of which are incorporated herein by reference.

BACKGROUND OF THE INVENTION

1. Field of the Invention

The present invention relates to a crystallization apparatus and a crystallization method. Specifically, the present invention relates to an apparatus and a method for forming a crystallized semiconductor film by irradiating a polycrystalline semiconductor film or an amorphous semiconductor film with a laser beam whose phase is modulated using a phase-shift mask.

2. Description of the Related Art

Conventionally, the materials of a thin-film transistor (TFT) used for, e.g., a switching element that controls a voltage to be applied to pixels of a liquid crystal display (LCD) are roughly divided into amorphous silicon and polysilicon. The electron mobility of the polysilicon is higher than that of the amorphous silicon. If, therefore, a transistor is formed by polysilicon, its switching speed becomes higher than that of a transistor formed by amorphous silicon, which brings about the advantages that the response speed of a display can increase and the design margins of other components can decrease. If, moreover, peripheral circuits such as a driver circuit and a DAC as well as a display main unit are incorporated into the display, they can be operated at higher speed.

Though polysilicon is formed of a set of crystal gains, its electron mobility is lower than that of image crystal silicon. A small-sized transistor that is formed by polysilicon has a problem of variations in the number of crystal grain boundaries in a channel section. A crystallization method for generating large-diameter image crystal silicon has recently been proposed in order to improve the electron mobility and lessen the variations in the number of crystal grain boundaries in a channel section.

As a crystallization method of this type, there has conventionally been known phase control excimer laser annealing (ELA) for forming a crystallized semiconductor film by applying an excimer laser beam to a phase-shift mask that is parallel and close to a polycrystalline semiconductor film or an amorphous semiconductor film. The details of the phase control ELA are disclosed in, for example, Surface Science, Vol. 21, No. 5, pp. 278-287, 2000. The same technology is also disclosed in Jpn. Pat. Appln. KOKAI Publication No. 2000-306859 (KOKAI date: November 2).

The phase control ELA generates a light intensity distribution of an inverted peak pattern in which the light intensity of a portion corresponding to a phase-shift section of the phase-shift mask is approximately zero (a pattern of light intensity which is approximately zero in the center of the phase-shift mask and suddenly increases toward the periphery thereof). A polycrystalline semiconductor film or an amorphous semiconductor film is irradiated with light having the light intensity distribution of an inverted peak pattern. As a result, a melting region is generated in accordance with the light intensity distribution, and a crystal nucleus is formed in a portion unmelted or solidified first in accordance with the portion whose light intensity is approximately zero. Crystal grows laterally from the crystal nucleus toward its periphery (lateral growth) to generate a large-diameter single crystal.

As described above, prior art (proxy method) for forming a crystallized semiconductor film by applying an excimer laser beam to a phase-shift mask that is parallel and close to a semiconductor film is known. However, the proxy method has a drawback in which the phase-shift mask is contaminated due to abrasion of the semiconductor film thereby to prevent good crystallization.

Applicant of the present application therefore proposes a technology (image defocus method) of forming a crystallized semiconductor film by defocusing a semiconductor film with respect to an image-forming optical system that is interposed between a phase-shift mask and a substrate to be processed (semiconductor film). Applicant also proposes a technology (image NA method) of arranging an image-forming optical system to optically conjugate a phase-shift mask and a semiconductor film and forming a crystallized semiconductor film by defining the numerical aperture of the image-forming optical system on its laser beam emitting side.

According to the above image defocus method and image NA method, generally, a KrF excimer laser light source that outputs a KrF excimer laser beam of a high output is employed and so is an image-forming optical system that is made of a single type of optical material (e.g., silica glass). In this case, the oscillation wavelength band of the KrF excimer laser beam is relatively broad (about 0.3 nm at full width at half maximum: see FIG. 5), and the image-forming optical system causes a relatively large chromatic aberration. Consequently, an influence of the broadband wavelength of the KrF excimer laser beam and the chromatic aberration of the image-forming optical system can prevent a required light intensity distribution from being generated on a substrate to be processed, such as a semiconductor film. In order to generate a required light intensity distribution on a semiconductor film, it can be thought that the waveband of a laser beam is narrowed using a prism, a diffraction grating or the like. If, however, the waveband of a laser beam is narrowed, a laser unit will be increased in size and complicated and its output will be lowered.

Using a laser beam whose waveband is narrow, generally, the light intensity distribution in a middle portion M between adjacent two inverted peak pattern portions R is accompanied by an irregular swell (see FIG. 4). In the crystallization process, a crystal nucleus is sometimes formed in a position of the swell of the middle portion M where the light intensity is low (or in an undesired position). Even though a crystal nucleus is formed in a desired position, the lateral growth, which starts from the crystal nucleus toward the periphery thereof, stops in a position of the middle portion M where the light intensity decreases. It is thus likely that a large crystal will be prevented from growing.

An object of the present invention is to provide a crystallization apparatus and a crystallization method capable of forming a crystal nucleus in a desired position and allowing a crystal to grow in a fully lateral direction from the crystal nucleus to thereby generate a large-diameter crystal grain.

BRIEF SUMMARY OF THE INVENTION

To solve the problem, according to a first aspect of the present invention, there is provided a crystallization apparatus comprising:

a phase-shift mask having at least two phase-shift sections;

an illumination system which emits a light beam of a given wavelength range to illuminate the phase-shift mask; and an image-forming optical system arranged in an optical path between the phase-shift mask and a subject to be processed, the phase-shift mask converting an intensity pattern of the light beam emitted from the illumination system so as to have a light intensity distribution having inverted peak pattern portions having a smallest peak value of light intensity in portions corresponding to the phase-shift section, and applying the light beam to the subject to crystallize the substrate, wherein the phase-shift mask and the subject are arranged in a conjugate position of the image-forming optical system, and the image-forming optical system has an aberration corresponding to the given wavelength range to form a light intensity distribution of waveform patterns with no swell of intensity in a middle portion between the inverted peak pattern portions on the subject.

According to a second aspect of the present invention, there is provided a crystallization apparatus comprising:

a light source which emits a light beam of a given wavelength range;

a phase-shift mask having at least two phase-shift sections, and converting an intensity pattern of the light beam emitted from the light source so as to have a light intensity distribution having inverted peak pattern portions whose light intensity is lowest at points corresponding to the phase-shift sections and applying the light beam to a subject to be processed to crystallize the substrate; and means for changing the light beam of the given wavelength range such that the light beam applied to the subject has a plurality of optical elements whose wavelengths are different and forming a light intensity distribution of waveform patterns with no swell of intensity in a middle portion between the inverted peak pattern portions on the subject.

According to a third aspect of the present invention, there is provided a method of crystallizing a subject to be processed by illuminating a phase-shift mask and irradiating the substrate with a light beam having a light intensity distribution of inverted peak pattern portions whose light intensity is lowest in portions corresponding to at least two phase-shift sections of the phase-shift mask, the method comprising:

illuminating the phase-shift mask with a light beam of a give wavelength range; and forming a light intensity distribution, which has no swell of intensity in a middle portion between the inverted peak pattern portions, on the subject through an image-forming optical system, the image-forming optical system being located to optically conjugate the phase-shift mask and the subject and having an aberration corresponding to the given wavelength range.

BRIEF DESCRIPTION OF THE SEVERAL VIEWS OF THE DRAWING

FIG. 1 is a schematic view showing a configuration of a crystallization apparatus according to an embodiment of the present invention.

FIG. 2 is a schematic view of the internal structure of an illumination system shown in FIG. 1.

FIGS. 3A and 3B are a plan view and a side view each showing a phase-shift mask used in the crystallization apparatus.

FIG. 4 is a graph showing a light intensity distribution of inverted peak pattern portions formed by an image defocus method and an image NA method.

FIG. 8 is a graph showing a light intensity distribution formed finally on the substrate to be processed in the example of numeric values according to the embodiment of the present invention.

FIGS. 9A and 9B are illustrations of the structure and function of an etalon that converts a broadband laser beam into optical elements of different wavelengths in different modifications to the embodiment of the present invention.

DETAILED DESCRIPTION OF THE INVENTION

Figure 5:
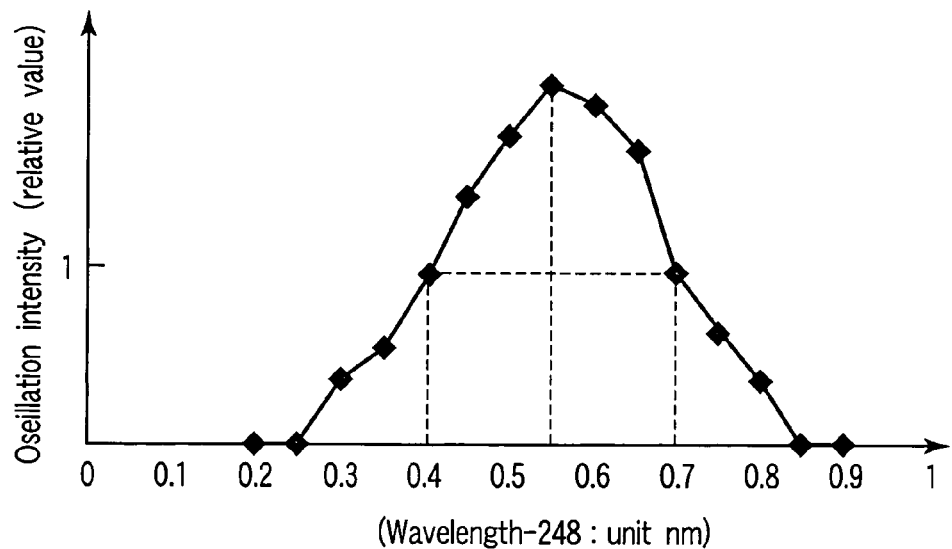
FIG. 5 is a graph showing an oscillation wavelength distribution of a KrF excimer laser light source in an example of numeric values according to the embodiment of the present invention.

An embodiment of the present invention will be described with reference to the accompanying drawings.

FIG. 1 is a schematic view showing a configuration of a crystallization apparatus according to the embodiment of the present invention, and FIG. 2 is a schematic view of the internal structure of an illumination system shown in FIG. 1. Referring to FIGS. 1 and 2, the crystallization apparatus of the present embodiment includes an illumination system 2 that illuminates a phase-shift mask 1. The illumination system 2 has a KrF excimer laser light source 2a that supplies a laser beam having a wavelength of 248 nm, a beam expander 2b arranged in sequence on the laser beam emitting side of the light source, a first fly-eye lens 2c, a first condenser optical system 2d, a second fly-eye lens 2e and a second condenser optical system 2f.

The laser beam supplied from the light source 2a expands into one having a given diameter through the beam expander 2b and then enters the first fly-eye lens 2c. Thus, a plurality of small light sources are formed on the rear focal plane of the first fly-eye lens 2c, and light fluxes of beams from the small light sources illuminate the incident plane of the second fly-eye lens 2e in a superimposed fashion through the first condenser optical system 2d. As a result, a plurality of small light sources the number more than the small light sources on the rear focal plane of the first fly-eye lens 2c are formed on the rear focal plane of the second fly-eye lens 2e. Beam fluxes from the small light sources illuminate the phase-shift mask 1 in a superimposed fashion through the second condenser optical system 2f.

The first fly-eye lens 2c and the first condenser optical system 2d make up a first homogenizer, and the first homogenizer uniforms the intensity with respect to the angle of incidence on the phase-shift mask 1. The second fly-eye lens 2e and the second condenser optical system 2f make up a second homogenizer, and the second homogenizer uniforms the intensity with respect to an in-plane position on the phase-shift mask. Thus, the illumination system applies a laser beam having an almost uniform light intensity distribution to the phase-shift mask 1.

A laser beam whose phase is modulated by the phase-shift mask 1 is applied to a substrate 4 to be processed through an image-forming optical system 3. The phase-shift mask 1 and the substrate 4 are located in an optically conjugate position of the image-forming optical system 3. The substrate 4 is obtained by sequentially forming an underlying film and an amorphous silicon film on a plate glass for liquid crystal displays by chemical vapor deposition. The substrate 4 is held in a given position on a substrate stage 5 by a vacuum chuck, an electrostatic chuck or the like. The substrate stage can be moved in X, Y and Z directions by a drive mechanism not shown.

FIGS. 3A and 3B are schematic views showing a structure of a phase-shift mask. Generally speaking, as described in the foregoing prior art, the phase-shift mask is made of a transparent medium, e.g., a quartz substrate having adjacent regions that vary in thickness. In a boundary of a step (phase-shift section) between the adjacent regions, the phase-shift mask diffracts the incident laser beam fluxes and makes them interfere with each other and provides the intensity of the incident laser beam with a periodical, spatial distribution.

More specifically, with reference to FIG. 3A, the phase-shift mask 1 has slit-shaped phase regions 1a and 1b of two types, which are alternately arranged in one direction (horizontal direction in FIG. 3A). The first phase region 1a and the second phase region 1b are formed to make a phase difference of 180° between their transmitted laser beam fluxes. If the phase-shift mask 1 is formed of silica glass having a refractive index of 1.5 with respect to a laser beam whose wavelength is 248 nm, a step of 248 nm is formed between the first phase region 1a and the second phase region 1b, as is understood from FIG. 3B. In other words, there is a 248 nm difference in thickness between both the regions 1a and 1b. A boundary between the first phase region 1a and the second phase region 1b corresponds to a phase-shift section 1c.

If an image defocus method (or an image NA method) is applied to an optical system whose light source supplies a single-wavelength or narrow-band laser beam and whose image-forming optical system has almost no aberration, the substrate 4 is located in a defocus position of an image-forming optical section (or the numerical aperture of the image-forming optical system on its laser beam emitting side is defined), with the result that a laser beam having a light intensity distribution of an inverted peak pattern corresponding to the phase of the phase-shift mask 1 is applied onto the substrate 4, as illustrated in FIG. 4. The light intensity distribution has the following characteristics. The light intensity is a minimum inverted peak value of approximately zero in a position corresponding to each of phase-shift sections 1c of the phase-shift mask 1, and increases one-dimensionally and continuously toward the periphery from the inverted peak value, or toward the first phase region 1a and the second phase region.

Referring to FIG. 4, the light intensity distribution in the middle portion M between adjacent two inverted peak pattern portions R, which are formed in accordance with adjacent two phase-shift sections 1c, exhibits an irregular swell (an undulate distribution in which the light intensity repeatedly increases and decreases). In this case, it is desirable to generate a crystal nucleus in a position where the inclination of the inverted peak pattern of the light intensity distribution is great (a position indicated by reference numeral 11 where the light intensity is not higher than a fixed value). If, however, there is a swell (a repeat of projections and depressions) in the middle portion M as described above, a crystal nucleus is likely to be generated in a position of the swell where the light intensity is low (an undesired position indicated by reference numeral 12).

Even though a crystal nucleus is generated in a desired position, the lateral growth that starts from the crystal nucleus to the periphery thereof will stop at a portion L of the boundary between each of the inverted peak pattern portions R and the middle portion M, where the light intensity decreases. In other words, the lateral growth starting from the crystal nucleus will be limited to the range of the width W of each of the inverted peak pattern portions (the distance between the proximal ends of the inverted peak pattern portions, or the distance between points or their vicinities where the increasing light intensity starts to decrease first). A considerably large crystal is therefore prevented from growing. Incidentally, in the image defocus method, the width W of each of the inverted peak pattern portions varies almost in proportion to the ½th power of the distance between the image surface of the image-forming optical system 3 and the substrate 4 (i.e., amount of defocus) if the image-forming optical system 3 has adequate resolution. On the other hand, in the image NA method, the width W of each of the inverted peak pattern portions is substantially equivalent to the resolution of the image-forming optical system.

As described above, the KrF excimer laser light source 2a supplies a laser beam whose oscillation wavelength band is relatively broad unless the band is particularly narrowed. If the image-forming optical system 3 is made of a single type of optical material (e.g., silica glass), a relatively large chromatic aberration occurs. In the present embodiment, an amount of occurrence of a chromatic aberration (generally an amount of occurrence of a wave aberration) of the image-forming optical system 3 is defined in accordance with the oscillation wavelength band of laser beams supplied from the KrF excimer laser light source 2a. Therefore, no swell of light intensity occurs in the middle portion, and the substrate (semiconductor film) 4 can be irradiated with a laser beam whose light intensity distribution has inverted peak pattern portions.

The principle of the present invention will be described below with reference to a specific example of numeric values.

FIG. 5 is a graph showing an oscillation wavelength distribution of the KrF excimer laser light source in the example of numeric values according to the present embodiment. In this graph, the horizontal axis indicates a position corresponding to the length obtained by subtracting 248 nm from the wavelength (unit: nm) and the vertical axis indicates the oscillation intensity (relative value). As shown in FIG. 5, the laser beam emitted from the KrF excimer laser light source 2a has a Gaussian intensity distribution as a whole. More specifically, the central wavelength λ of the laser beam is 248.55 nm, and the full width at half maximum of the oscillation wavelength distribution is about 0.3 nm (full width at half maximum $\Delta\lambda \approx 0.15$ nm).

In the example of numeric values according to the present embodiment, the image-forming optical system 3 is made of only silica glass and telecentric for both object and image sides at an equal magnification. More specifically, the whole length of the image-forming optical system 3 (the distance between the object surface and the image surface) is 1000 mm (an 4f optical system: f=250 mm), and the numerical aperture thereof on its laser beam emitting side is 0.1. The illumination NA of the illumination system 2 is 0.05. The pitch P between the phase-shift sections 1c in the phase-shift mask 1, or the width of each of the phase regions 1a and 1b is 10 μm (see FIG. 3).

Figures 6A, 6B:
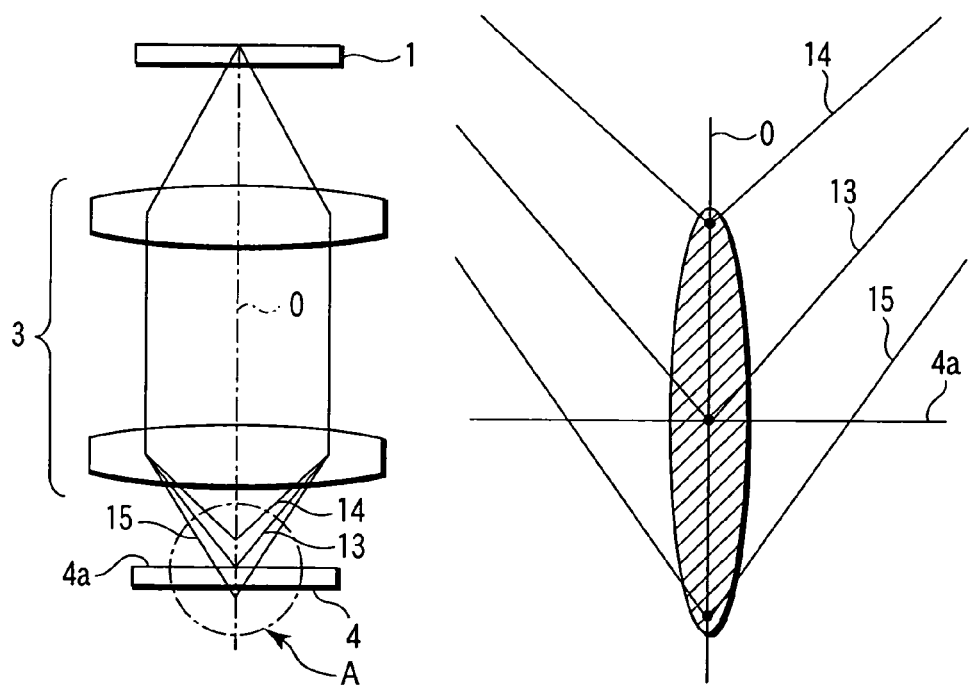
FIGS. 6A and 6B are illustrations of an influence of a chromatic aberration of an image-forming optical system in the embodiment of the present invention.

The displacement of an image-forming position due to the chromatic aberration of the image-forming optical system 3 will now be described with reference to FIGS. 6A and 6B.

When no chromatic aberration occurs in the image-forming optical system 3, light beams emitted from one point on the optical axis O of the phase-shift mask 1, which do not rely upon their wavelengths, are focused through the image-forming optical system 3 upon one point on the optical axis O of the surface 4a of the substrate 4 to thereby form a point image. In the present embodiment, however, a chromatic aberration occurs in the image-forming optical system 3. Therefore, as shown in FIG. 6A, of the light beam emitted from one point on the optical axis O of the phase-shift mask 1, a light beam 13 of a central wavelength is focused upon the optical axis O on the surface 4a of the substrate 4, a light beam 14 of a wavelength shorter than the central wavelength is focused upon the optical axis O above the surface 4a of the substrate 4 (on the image-forming optical system side), and a light beam 15 of a wavelength longer than the central wavelength is focused upon the optical axis below the surface 4a of the substrate 4 (on the opposite side of the image-forming optical system). Consequently, in the present embodiment, the light beam emitted from one point on the optical axis of the phase-shift mask 1 form an image, which is defocused to elongate along the optical axis O as indicated by a hatched ellipse in FIG. 6B, on the surface 4a of the substrate 4. Since, moreover, the image-forming optical system 3 is telecentric for both sides, the amounts of defocus in all points on the flat surface 4a of the substrate 4 are almost equal to each other, and the image is defocused in a direction parallel to the optical axis. Paying attention to the points corresponding to the respective wavelengths of images elongated in the direction of the optical axis, or the points defocused from the surface 4a of the substrate 4, the light intensity distribution finally formed on the surface 4a of the substrate 4 is one obtained by superimposing (synthesizing) light intensity patterns formed by light fluxes of the respective wavelengths.

The following Table 1 shows a relationship between an amount of wavelength displacement (nm) that is obtained by subtracting the central wavelength λ from the wavelength of each of the light beams and an amount of longitudinal aberration (amount of defocus: μm) that occurs in each of the light beams due to the chromatic aberration of the image-forming optical system 3 in the example of numeric values according to the present embodiment. It is seen from Table 1 that the amount of wavelength displacement and the amount of longitudinal aberration are almost in proportion to each other. The relationship shown in Table 1 is a result of computations performed on the assumption that the image-forming optical system 3 is a thin lens. This relationship is generally established even in the actual image-forming optical system 3 that is formed by a combination of a plurality of lenses.

Figure 7:
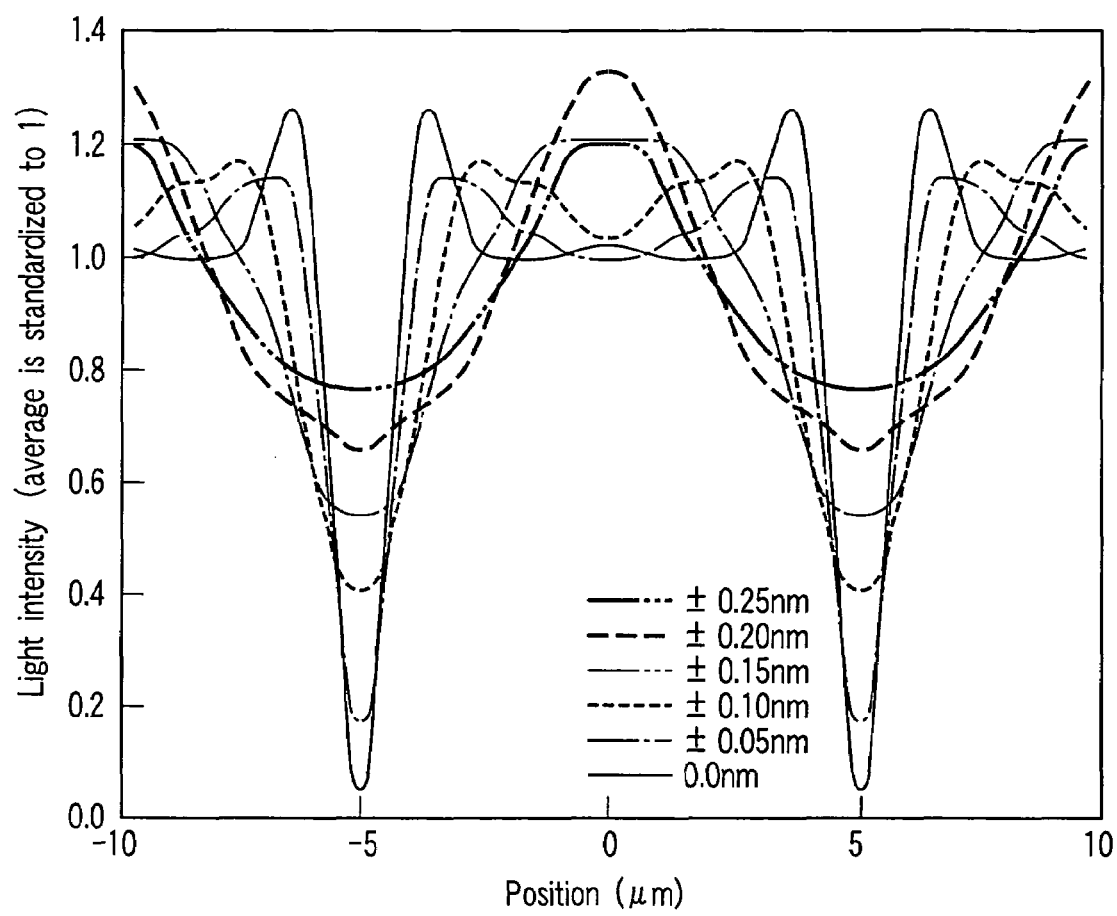
FIG. 7 is a graph showing light intensity patterns formed on a substrate to be processed by optical elements of respective wavelengths in the example of numeric values according to the embodiment of the present invention.

FIG. 7 is a graph showing light intensity pattern formed on the substrate by a light beams of respective wavelengths in the example of numeric values according to the present embodiment. FIG. 8 is a graph showing a light intensity distribution finally formed on the substrate 4 in association with the phase-shift mask in the example of numeric values according to the present embodiment. In FIG. 7, reference numeral 21 indicates a light beam (solid line) whose wavelength coincides with the central wavelength λ, reference numeral 22 indicates a light beam (one-dot-one-dash line) whose wavelength is displaced by ±0.05 nm from the central wavelength λ, reference numeral 23 indicates a light beam (broken line) whose wavelength is displaced by ±0.1 nm from the central wavelength λ, reference numeral 24 indicates a light beam (two-dot-one-dash line) whose wavelength is displaced by ±0.15 nm from the central wavelength λ, reference numeral 25 indicates a light beam (chain line) whose wavelength is displaced by ±0.2 nm from the central wavelength λ, and reference numeral 26 indicates a light beam (three-dot-one-dash line) whose wavelength is displaced by ±0.25 nm from the central wavelength λ.

Referring to FIG. 7, a light intensity pattern formed by the light beam 21 whose wavelength coincides with the central wavelength λ corresponds to the light intensity distribution having inverted peak pattern portions and a middle portion shown in FIG. 4. However, as the wavelength displaces from the central wavelength λ, the minimum value of each of the inverted peak pattern portions increases to some extent, but a degree to which the light intensity suddenly decreases from each of the inverted peak pattern portion toward the middle portion is lowered (the level of normal peak patterns located both sides of each of the inverted peak pattern portions is lowered. In the light beam whose wavelength is displaced greater than a fixed distance, i.e., the light beams 24 to 26 whose wavelengths are each displaced greater than ±0.15 nm from the central wavelength λ, the light intensity does not decrease from each of the inverted peak pattern portions toward the middle portion (no normal peak patterns occur), and almost no swell of light intensity occurs in the middle portion.

As described above, the light intensity patterns formed by light beams of respective wavelengths (i.e., the light intensity patterns shown in FIG. 7) are superimposed to obtain a light intensity distribution that is finally formed on the surface 4a of the substrate 4. In the example of numeric values according to the present embodiment, as shown in FIG. 8, the surface 4a of the substrate 4 is irradiated with the light beam of a light intensity pattern distribution having a normal peak pattern (angle pattern) in which the light intensity has no swell in the middle portion M between the inverted peak pattern portions R but increases slightly and substantially monotonously toward the center of the middle portion.

The term "mountain shape" used in the specification means a pattern or shape of a mountain or triangular shape having not only an angular top but also a sounded or non-angular top.

TABLE 1

| Amount of Wavelength Displacement | 0.00 | 0.05 | 0.10 | 0.15 | 0.20 | 0.25 | −0.05 | −0.10 | −0.15 | −0.20 | −0.25 |
|---|---|---|---|---|---|---|---|---|---|---|---|
| Amount of Longitudinal Aberration | 0 | 19 | 39 | 58 | 77 | 97 | −19 | −39 | −58 | −77 | −97 |

Consequently, any crystal nucleus can be generated not in the middle portion M but in a position where the inclination of the inverted peak pattern portions of the light intensity distribution is great (or a position where the intensity is not higher than a fixed value). Furthermore, the light intensity does not decrease in the boundary between each of the inverted peak pattern portions R and the middle portion M (no normal peak patterns L are formed), but increases slightly and monotonously toward the center of the middle portion M; therefore, the lateral growth starting from the crystal nucleus toward its periphery is not limited to the range of the width of each of the inverted peak pattern portions. Thus, in the present embodiment, a crystal nucleus can be generated in a desired position and a considerably lateral growth from the crystal nucleus can be achieved to form a large-diameter crystallized semiconductor film.

There now follows an explanation of conditional expressions to obtain a light intensity distribution of patterns in which the light intensity increases slightly and monotonously toward the center of the middle portion M. The width W of an inverted peak pattern portion formed when a longitudinal aberration due to the chromatic aberration of the image-forming optical system 3 has a maximum value D is given by the following expression (1) based on the theory that is generally understood as a method of determining a diffraction pattern of a Becke line.

$$W=2\times 1.2(\lambda \cdot D/2)^{1/2} \tag{1}$$

where $\lambda$ is the central wavelength of a laser beam supplied from the light source 2a.

Considering a process of the computation in the above example of numeric values, it is desirable that the width W of each of inverted peak pattern portions be substantially the same as the pitch X between the inverted peak pattern portions (see FIG. 8) in order to obtain a light intensity distribution of patterns in which the light intensity increases slightly and monotonously toward the center of the middle portion M. More specifically, the light intensity pattern corresponding to the light beam 24 in FIG. 7 is close to this condition. Considering that an adequate advantage is obtained if the width W of each of inverted peak pattern portions is somewhat close to the pitch X between the inverted peak pattern portions, it is desirable that the following expression (2) be established between the width W and the pitch X.

$$0.5\times X \leq 2\times X \tag{2}$$

A relationship between the pitch X between the inverted peak pattern portions and the pitch P between the phase-shift sections of the phase-shift mask 1 depends upon the image-forming magnification of the image-forming optical system 3. In the example of numeric values according to the present embodiment, the image-forming magnification of the image-forming optical system 3 is equal magnification and thus the pitch X between the inverted peak pattern portions coincides with the pitch P between the phase-shift sections. Substituting the expression (1) for the expression (2), the conditions of the following expression (3) are derived, as are those of the following expression (4).

$$0.25X^2/(2\times 1.44\lambda) \leq D \leq 4X^2/(2\times 1.44\lambda) \tag{3}$$

$$0.87 \leq D \cdot \lambda/X^2 \leq 1.389 \tag{4}$$

Substituting X=10 μm and $\lambda$=0.24855 μm for the expression (4) as specific values of the example of numeric values, the following conditional expression (5) is obtained with respect to the maximum value D of the longitudinal aberration due to the chromatic aberration of the image-forming optical system 3.

$$35\ \mu m \leq D \leq 560\ \mu m \tag{5}$$

Referring again to Table 1, it is understood that the conditional expression (5) is satisfied even though an amount of longitudinal aberration 97 μm corresponding to the maximum wavelength or the minimum wavelength is used as the maximum value D of the longitudinal aberration or an amount of longitudinal aberration 58 μm corresponding to the half width is used. As described above with reference to Table 1, the image-forming optical system 3 with a chromatic aberration has a linear relationship between an amount of displacement of a wavelength from the central wavelength $\lambda$ and an amount of defocus (an amount of longitudinal aberration). In other words, the maximum value D of the longitudinal aberration corresponding to the half width can be expressed by the following equation (6).

$$D=k\times \Delta \lambda \tag{6}$$

where $\Delta \lambda$ is a half width at half maximum in the intensity distribution of the laser beam supplied from the light source 2a, and k is a coefficient showing a ratio of the amount of defocus to the amount of displacement of wavelength from the central wavelength $\lambda$. The conditional expression (4) can thus be modified to the following conditional expression (7) with reference to the relationship of the equation (6).

$$0.087 \leq k\cdot \Delta \lambda \cdot \lambda/X^2 \leq 1.389 \tag{7}$$

In the present embodiment, it is desirable to satisfy the conditional expression (4) or (7) to obtain a light intensity distribution of patterns in which the light intensity increases slightly and monotonously toward the center of the middle portion. In the foregoing embodiment, the KrF excimer laser light source 2a supplies a laser beam having a Gaussian intensity distribution as a whole. As a modification to this, however, the KrF excimer laser light source 2a can supply a laser beam having a maximum intensity at a plurality of given wavelengths that differ from one another.

Figure 10A:
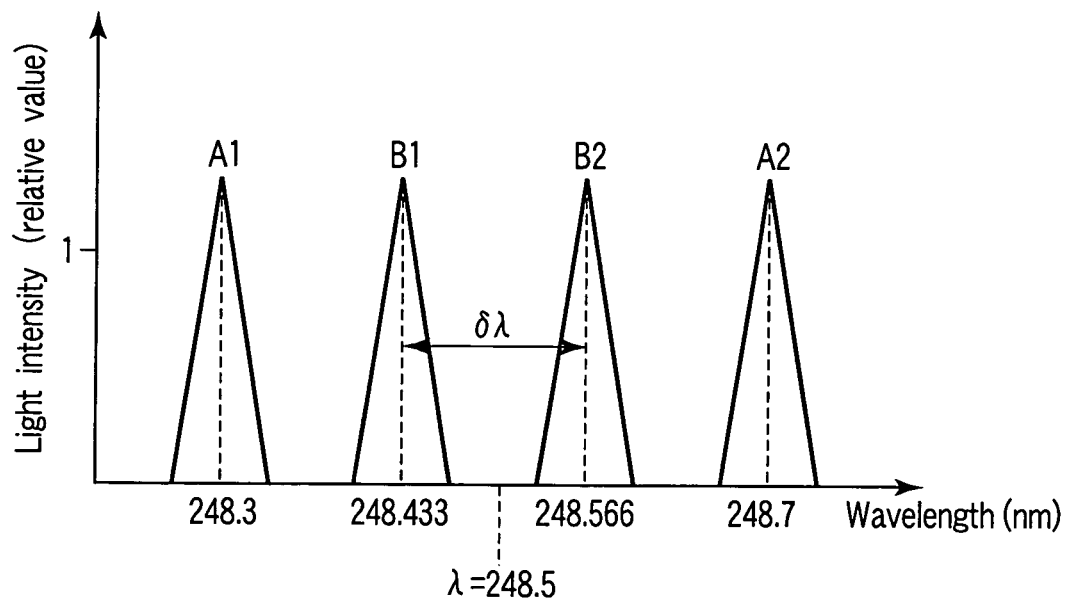
FIGS. 10A and 10B are charts of an oscillation wavelength distribution of a light source and point images formed by a plurality of wavelength light beams.
Figure 10B:
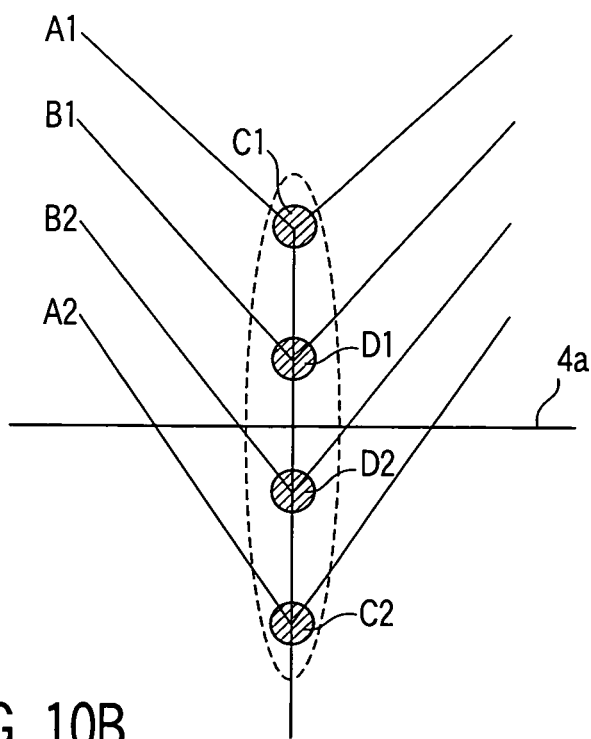

FIGS. 9A and 9B are illustrations of the structures and functions of different etalons each of which converts a broadband wavelength light beam into a plurality of light beams of different wavelengths as modifications to the present embodiment. The etalon shown in FIG. 9A is an air gap type etalon and that shown in FIG. 9B is a solid type etalon. FIGS. 10A and 10B are charts showing a light source oscillation wavelength distribution and point images formed by a plurality of wavelength light beams in the modifications to the present embodiment. The etalon 28 shown in FIG. 9A is made up of a pair of parallel flat plates 28a and 28b arranged with a given gap t therebetween. These parallel flat plates 28a and 28b are each formed of transparent glass. In the etalon 28 so formed, a light beam that has passed through the first flat plate 28a, e.g., a laser beam is applied to and/or reflected by the incident surface of the second flat plate 28b and finally emitted from the second flat plate 28b as light having a plurality of optical elements whose wavelengths differ from each other. In this case, a peak interval $\delta \lambda$ between a plurality of (four in this embodiment) discrete wavelength light beams, which are formed by the etalon 28 based on a broadband wavelength incident laser beam, is represented by the following equation (8).

$$\delta \lambda = \lambda^2/(2t \cos \theta) \tag{8}$$

where $\lambda$ is the central wavelength of a broadband wavelength light beam that is inherently supplied from the light source 2a and its value is 248.5 nm in the present modification, and θ is an incident angle of a laser beam to the etalon and its value is 0 degree. To obtain a peak interval δλ of 0.133 nm, for example, a given gap t has to be set to 231 μm. In other words, a light beam having four peak wavelengths whose peak shapes are the same in the intensity distribution as shown in FIG. 10A can be obtained based on a broadband wavelength light beam supplied from the light source 2a by the action of the etalon 28 with a gap t of 231 μm.

The light beam having four peak wavelengths includes a first wavelength optical component A1 whose central wavelength is 248.3 nm, a second wavelength optical component B1 whose central wavelength is 248.433 nm, a third wavelength optical component B2 whose central wavelength is 248.566 nm, and a fourth wavelength optical component A2 whose central wavelength is 248.7 nm. In this case, as shown in FIG. 10B, the first wavelength optical component A1 forms a point image C1, which is defocused due to a chromatic aberration of the image-forming optical system 3, above the surface 4a of the substrate 4 (toward the image-forming optical system 3). The second wavelength optical component B1 forms a defocused point image D1 between the surface 4a of the substrate 4 and the point image C1. Similarly, the third wavelength optical component B2 forms a defocused point image D2 in a position that is diametrically opposed to the point image D1 with regard to the surface 4a of the substrate to be processed. The fourth wavelength optical component A2 forms a defocused point image C2 in a position that is diametrically opposed to the point image C1 with regard to the surface 4a of the substrate 4. The intervals of these point images (C1, D1, D2, C2) are the same. The point images are included in an elliptic region (indicated by hatching) corresponding to an elliptic hatched portion indicative of a defocused image that is elongated in the direction of the optical axis in FIG. 6.

In the present modification, too, the light intensity distribution finally formed on the surface 4a of the substrate 4 is one obtained by superimposing (synthesizing) light intensity patterns formed by the wavelength optical components (A1, B1, B2, A2).

It will be understood that the same advantage as that of the above air gap type etalon can be obtained from another type of etalon, e.g., a solid type etalon with a reflecting film 29a on either side of a transparent flat substrate 29 having a thickness of t as shown in FIG. 9B.

Figure 11:
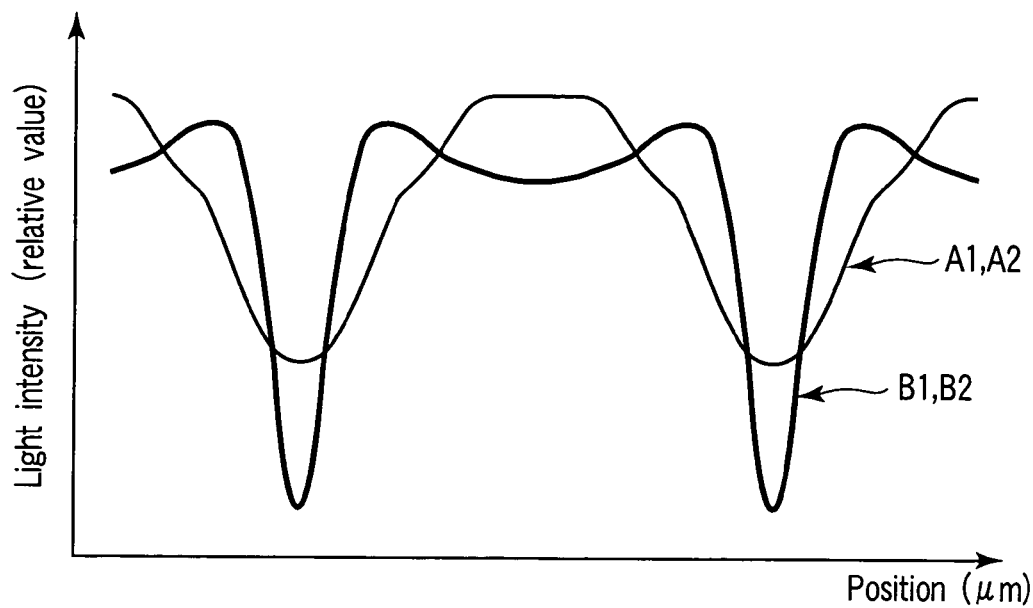
FIG. 11 is a graph showing light intensity patterns formed on a substrate to be processed by optical elements of different wavelengths in the modifications to the embodiment of the present invention.

FIG. 11 is a graph showing a light intensity pattern formed on the substrate by each of the four wavelength optical components (A1, B1, B2, A2) described above.

Referring to FIG. 11, in the light intensity patterns formed by the second and third wavelength optical components B1 and B2 whose wavelengths are each relatively close to the central wavelength λ, the light intensity tends to decrease to some extent from each of the inverted peak pattern portions toward the middle portion therebetween. In contrast, in the light intensity patters formed by the first and fourth wavelength optical components A1 and A2 whose wavelengths are each distant from the central wavelength λ, the minimum value of each of the inverted peak pattern portions increases, whereas the light intensity does not decrease from each of the inverted peak pattern portions toward the middle portion therebetween or no swell of the light intensity occurs in the middle portion.

Figure 12:
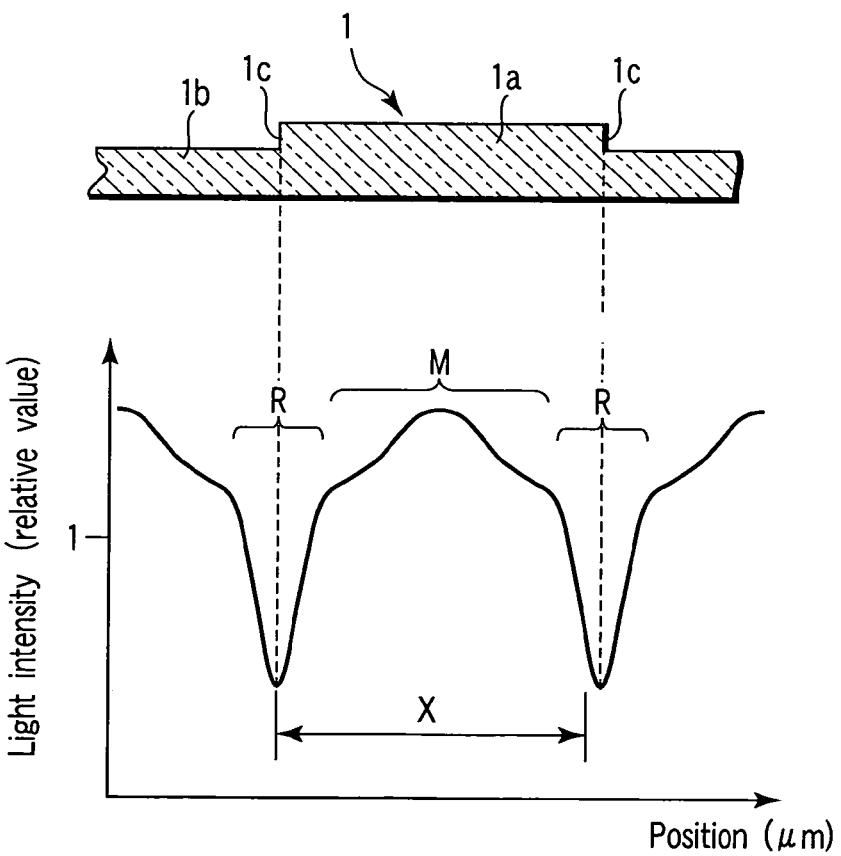
FIG. 12 is a graph showing a light intensity distribution formed finally on a substrate to be processed in the modifications to the embodiment of the present invention.

FIG. 12 is a graph showing a light intensity distribution obtained by synthesizing the optical components shown in FIG. 11 and finally formed on the substrate 4.

As shown in FIG. 12, a light intensity distribution in which no swell of light intensity occurs in the middle portion M between the inverted peak pattern portions R but the light intensity increases monotonously toward the center of the middle portion M, is finally formed on the surface 4a of the substrate 4. Thus, any crystal nucleus is not generated in the middle portion M but can be done in a position where the inclination of the inverted peak pattern portions R in the light intensity distribution is great. Since the light intensity increases monotonously toward the center of the middle portion M more clearly than in the above-described embodiment, the lateral crystal growth starting from a crystal nucleus toward its periphery is easy to reach almost the central part of the middle portion without being limited to the range of the width of each of the inverted peak pattern portions.

In the present modification, too, a crystal nucleus can be generated in a desired position and an adequate lateral crystal growth from the crystal nucleus can be achieved to form a large-diameter crystallized semiconductor film, as in the above embodiment. In the present modification, the degree of freedom of design for the shape and the number of peaks of each wavelength light beam is higher than that in the above embodiment. It is thus easier to achieve a light intensity distribution in which the light intensity increases positively and monotonously toward the center of the middle portion than in the above embodiment.

In the above modification, a broadband wavelength light beam is converted into a plurality of wavelength light beams using an etalon. However, the present invention is not limited to this. If a plurality of laser beams that slightly vary in oscillation wavelength are synthesized, a plurality of desired wavelength light beams can be obtained using a plurality of light source sections for supplying light beams whose central wavelengths generally differ from one another and a synthesizing section for synthesizing a plurality of laser beams supplied from the light source sections. Instead, a plurality of desired wavelength light beams can be obtained by inserting a multi-film mirror, which reflects only the light beam of a specific wavelength, into an illumination optical path of a broadband wavelength light beam. In this case, it is seen from FIG. 7 that a great improvement can be provided simply by eliminating only the central wavelength that contributes to a swell of the intensity distribution the most.

The above embodiment employs the phase-shift mask 1 that is formed by one-dimensionally arranging two types of slit-shaped phase regions corresponding to phases 0 and π. However, the present invention is not limited to this, but a phase-shift mask that is formed by two-dimensionally arranging four rectangular regions corresponding to phases 0, π/2, π, and 3π/2 can be used. Furthermore, in general, a phase-shift mask having an intersection point (phase shift section) of three or more phase shift lines and formed such that the integral of the complex transmittance of a circular region with the intersection point at the center can be used. Moreover, a phase-shift mask having a circular step corresponding to a phase-shift section and set such that a phase difference between a transmitted light beam of the circular step and its surrounding transmitted light beam becomes π can be used. The light intensity distribution can be computed even in the design stage, but it is desirable to observe and confirm the light intensity distribution on the actual surface to be processed (the surface to be exposed). To do this, the surface to be processed has only to be expanded by an optical system to receive a light beam through an image pickup device such as a CCD. When a light beam for use is ultraviolet rays, the optical system subjects to constraints and thus the light beam can be converted to a visible one by providing a fluorescent plate on the surface to be processed.

A method of manufacturing an electronic device by the manufacturing device and method of the present invention will be described with reference to FIGS. 13A to 13E.

Figure 13A:
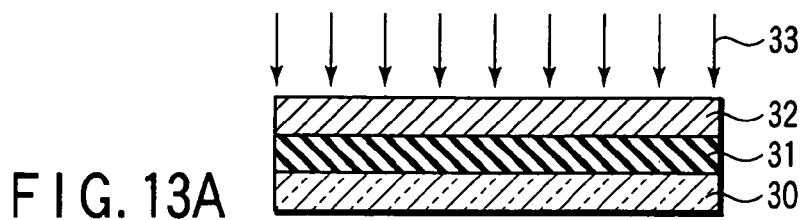
FIGS. 13A to 13E are sectional views of steps of manufacturing an electronic device using the crystallization apparatus according to the embodiment of the present invention.
Figure 13B:
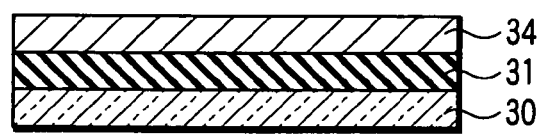

As illustrated in FIG. 13A, an underlayer film 31 (e.g., a laminated film of an SiN film having a thickness of 50 nm and an $SiO_2$ film having a thickness of 100 nm) and an amorphous semiconductor film 32 (e.g., Si, Ge and SiGe each having a thickness of about 50 nm to 200 nm) are formed all over a rectangular insulation substrate 30 (e.g., alkaline glass, silica glass, plastic, and polyimide) by chemical vapor deposition, sputtering and the like. Then, an excimer laser beam 33 (e.g., KrF and XeC1) is applied to part or all of the surface of the amorphous semiconductor film 32. To apply the excimer laser beam, the device and method of the above embodiment are used. Consequently, the amorphous semiconductor film 32 is crystallized into a polycrystalline semiconductor film 34 as shown in FIG. 13B. The polycrystalline semiconductor film 34 so formed is converted to a polycrystallized or single crystallized semiconductor film whose crystal grain positions are controlled and whose crystal grain diameter is larger than that of a polycrystalline semiconductor film formed by the conventional manufacturing device.

Figure 13C:
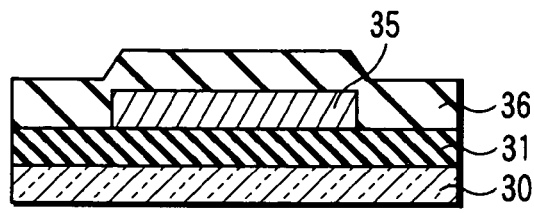
Figure 13D:
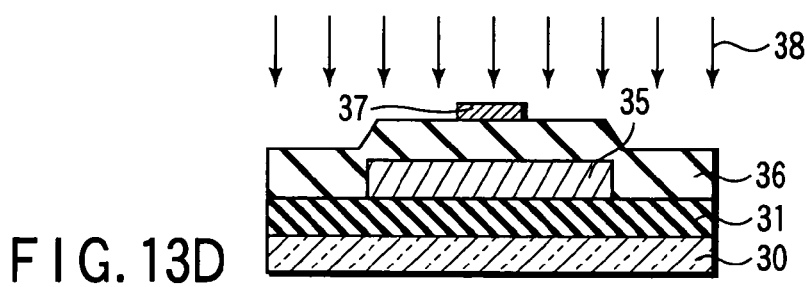

The polycrystallized semiconductor film 34 is processed by photolithography to form island-like semiconductor films 35. As shown in FIG. 13C, an $SiO_2$ film having a thickness of 20 nm to 100 nm is formed on the underlayer film 31 and semiconductor film 35 as a gate insulation film 36 by chemical vapor deposition, sputtering or the like.

Then, a gate electrode 37 (e.g., silicide and MoW) is formed in a location corresponding to the semiconductor film 35 on the gate film 36. Using the gate electrode 37 as a mask, impurity ions 38 (phosphorus is used when the device is an N-channel transistor, and boron is used when it is a P-channel transistor) are implanted into the semiconductor film 35 to make this film an N type or a P type. After that, the entire device is annealed in a nitrogen atmosphere (e.g., for one hour at 450°) to activate the impurities in the semiconductor film 35. As a result, the semiconductor film 35 serves as a source 41 and a drain 42 both having a high impurity concentration, and a channel region 40 located therebetween, corresponds to the gate electrode 37 and having a low impurity concentration.

Figure 13E:
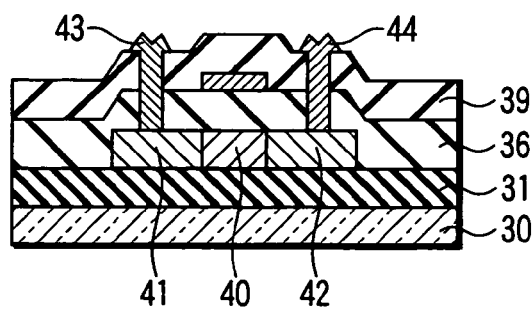

An interlayer insulation film 39 is formed on the gate film 36. Then, contact holes are formed in those portions of the interlayer insulation film 39 and gate film 36 that correspond to the source 41 and drain 42. After that, a source electrode 43 and a drain electrode 44, which are electrically connected to the source 41 and drain 42 through the contact holes, are formed on the interlayer insulation film 39 by deposition and patterning, as shown in FIG. 13E. It can be understood that the thin-film transistor so formed is a large-diameter polycrystal or monocrystal since a semiconductor that forms the channel 40 is processed by laser beam irradiation as described with reference to FIGS. 13A and 13B. The switching speed of such a transistor is higher than that of a transistor using an amorphous semiconductor to which no laser beam is applied. A polycrystallized or single crystallized transistor can be designed to have a liquid crystal driving function and a function of integrated circuits such as a memory (SRAM, DRAM) and a CPU. A circuit that requires a withstanding voltage is formed in an amorphous semiconductor film, while a transistor of a driver circuit that requires high-speed mobility is polycrystallized or monocrystallized.

As described above, according to the present invention, an inverted peak pattern light intensity distribution is formed on the substrate to be processed, in which the light intensity does not decrease in the boundary between each of the inverted peak pattern portions and the middle portion therebetween but increases monotonously toward the center of the middle portion through a cooperation between a light source for supplying light beams within a given range of wavelengths and an image-forming optical system having an aberration corresponding to the range of wavelengths. Consequently, a crystal nucleus can be generated in a desired position and an adequate lateral growth from the crystal nucleus can be achieved to form a large-diameter crystallized semiconductor film.

In the above descriptions, a subject to be crystallized is regarded as a substrate to be processed. It will be understood that the subject to be processed is an amorphous and polycrystalline layer or film formed on the substrate, as described in the above embodiment. To crystallize a substrate in itself is also included in the present invention and, in this case, the substrate serves as a subject to be processed. The material to be crystallized is not limited to silicon. For example, another semiconductor such as Ge and SiGe can be used. The material is not limited to a semiconductor but has only to be metal if it has crystallinity. In the present invention, crystallization means improving a degree of crystallization. For example, the crystallization of an amorphous matter means that it is converted to a polycrystalline or image crystal matter, and that of a polycrystalline matter means that it is converted to a image crystal matter.

In the present invention, the phase-shift section of the phase-shift mask is not limited to a boundary or a point between different phase regions, but includes a nearby portion of the boundary and point. For example, when a light-shield region that extends along the boundary of the phase-shift mask is provided in one of adjacent phase regions, the light-shield region is a phase-shift section. In other words, an inverted peak pattern portion having a peak value of the minimum strength is formed to correspond to the light-shield region.

What is claimed is:

1. A crystallization apparatus comprising:
   a phase-shift mask having at least two phase-shift sections;
   an illumination system which emits a light beam of a given wavelength range to illuminate the phase-shift mask; and
   an image-forming optical system arranged in an optical path between the phase-shift mask and a subject to be processed, the phase-shift mask converting an intensity pattern of the light beam emitted from the illumination system so as to have a light intensity distribution having inverted peak pattern portions having a smallest peak value of light intensity in portions corresponding to the phase-shift section, and applying the light beam to the subject to crystallize the substrate,
   wherein the phase-shift mask and the subject are arranged in a conjugate position of the image-forming optical system, and
   the image-forming optical system has an aberration corresponding to the given wavelength range to form a light intensity distribution of waveform patterns with no swell of intensity in a middle portion between the inverted peak pattern portions on the subject,
   wherein the aberration corresponding to the given wavelength range is a chromatic aberration that represents that optical components of different wavelengths vary in image-forming positions almost in a direction of an optical axis.

2. The crystallization apparatus according to claim 1, wherein the illumination system has a light source which supplies a light beam having a Gaussian wavelength-to-intensity distribution as a whole.

3. The crystallization apparatus according to claim 1, wherein the illumination system has a light source which supplies a light beam having a maximum intensity at a plurality of given wavelengths that differ from one another.

4. The crystallization apparatus according to claim 3, wherein the given wavelengths are provided at almost regular intervals within the given wavelength range.

5. The crystallization apparatus according to claim 3, wherein the light source includes an etalon having an interval between reflection planes corresponding to an interval between the given wavelengths.

6. The crystallization apparatus according to claim 3, wherein the light source has a plurality of light source sections which supply light beams of central wavelengths that differ from one another in accordance with the given wavelengths and a synthesizing section which synthesizes a plurality of light beams supplied from the light source sections.

7. The crystallization apparatus according to claim 6, wherein when a maximum value of a longitudinal aberration caused due to the aberration based on the light beam supplied from the light source is D, a central wavelength of the light beam supplied from the light source is $\lambda$, and a pitch between the inverted peak pattern portions formed on the subject is X, a following expression is satisfied:

$$0.87 \leq D \cdot \lambda / X^2 \leq 1.389.$$

8. The crystallization apparatus according to claim 6, wherein when a central wavelength of the light beam supplied from the light source is $\lambda$, a half width at half maximum of the intensity distribution of the light beam supplied from the light source is $\Delta\lambda$, a coefficient indicating a ratio of an amount of defocus to an amount of displacement of a wavelength from the central wavelength $\lambda$ is k, and a pitch between the inverted peak pattern portions formed on the subject is X, a following expression is satisfied:

$$0.087 \leq k \cdot \Delta\lambda \cdot \lambda / X^2 \leq 1.389.$$

9. The crystallization apparatus according to claim 8, wherein the optical system includes optical member provided between the phase-shift mask and the subject to change a light beam having inverted peak pattern portions, which is emitted from the phase-shift mask, so as to have a plurality of optical components whose wavelengths are different and apply the light beam to the subject.

10. A crystallization apparatus comprising:
a light source which emits a light beam of a given wavelength range;
a phase-shift mask having at least two phase-shift sections, and converting an intensity pattern of the light beam emitted from the light source so as to have a light intensity distribution having inverted peak pattern portions whose light intensity is lowest at points corresponding to the phase-shift sections and applying the light beam to a subject to be processed to crystallize the substrate; and
means for changing the light beam of the given wavelength range such that the light beam applied to the subject has a plurality of optical components whose wavelengths are different; and
an image-forming optical system having an aberration corresponding to said plurality of optical components to form a light intensity distribution of waveform patterns with no swell of intensity in a middle portion between the inverted peak pattern portions on the subject,
wherein the aberration corresponding to the given wavelength range is a chromatic aberration that represents that optical components of different wavelengths vary in image-forming positions almost in a direction of an optical axis.

11. The crystallization apparatus according to claim 10, wherein the optical system sets the light intensity distribution in cooperation with the phase-shift mask such that a middle portion between the waveform patterns has a mountain shape on the subject.

12. The crystallization apparatus according to claim 10, wherein the optical system includes optical member provided between the light source and the phase-shift mask to change the light beam of the given wavelength range, which is emitted form the light source, so as to have a plurality of optical components whose wavelengths are different and apply the light beam to the phase-shift mask.

* * * * *